United States Patent
Cabral, Jr. et al.

(10) Patent No.: US 6,794,226 B2
(45) Date of Patent: Sep. 21, 2004

(54) SEMICONDUCTOR DEVICE INCORPORATING ELEMENTS FORMED OF REFRACTORY METAL-SILICON-NITROGEN AND METHOD FOR FABRICATION

(75) Inventors: Cyril Cabral, Jr., Ossining, NY (US); Lawrence Clevenger, LaGrangeville, NY (US); Louis Lu-Chen Hsu, Fishkill, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/374,395

(22) Filed: Feb. 26, 2003

(65) Prior Publication Data

US 2003/0151116 A1 Aug. 14, 2003

Related U.S. Application Data

(62) Division of application No. 09/760,245, filed on Jan. 12, 2001, now Pat. No. 6,545,339.

(51) Int. Cl.[7] .................. H01L 21/82; H01L 21/8238; H01L 21/20; H01L 21/44
(52) U.S. Cl. .............. 438/132; 438/215; 438/253; 438/281; 438/385; 438/396; 438/627; 438/653
(58) Field of Search ................. 438/132, 215, 438/281, 333, 467, 601, 253, 254, 382, 396–398, 627, 643, 648, 650, 653, 656, 683, 685, 927, 957; 257/532, 536, 296, 529

(56) References Cited

U.S. PATENT DOCUMENTS

| | | | |
|---|---|---|---|
| 5,892,281 A | 4/1999 | Akram et al. | 257/750 |
| 6,150,689 A | 11/2000 | Narui et al. | 257/306 |
| 6,232,174 B1 | 5/2001 | Nagata et al. | 438/253 |
| 6,336,713 B1 | 1/2002 | Regan et al. | 347/62 |
| 6,358,794 B1 | 3/2002 | Oh | 438/253 |

*Primary Examiner*—Hung Vu
(74) *Attorney, Agent, or Firm*—Robert M. Trepp; Randy W. Tung

(57) ABSTRACT

A semiconductor structure that includes at least one circuit element of a fuse, a diffusion barrier or a capacitor that is formed by refractory metal-silicon-nitrogen is disclosed. A method for fabricating such semiconductor structure that includes a fuse element, a diffusion barrier, a resistor or a capacitor by a refractory metal-silicon-nitrogen material is further disclosed. A suitable refractory metal-silicon-nitrogen material to be used is TaSiN which provides a wide range of resistivity by changing the ratio of Ta:Si:N. The invention provides the benefit that the various components of diffusion barriers, fuses, capacitors and resistors may be formed by a single deposition process of a TaSiN layer, the various components are then selectively masked and treated by either heat-treating or ion-implantation to vary their resistivity selectively while keeping the other shielded elements at the same resistivity.

12 Claims, 5 Drawing Sheets

Annealed in Nitrogen at 3 C/s from 200-1150 C
and monitored with in situ w-ray diffraction analysis

| Composition Ta:Si:N (at. %) | N2 in the Ar Plasma (%) | O & Ar in Films O:Ar (at. %) | Resistivity (mOhm-cm) | Density (gm/cm³) |
| --- | --- | --- | --- | --- |
| 78:22:0 | 0 | 2.3:0.3 | 0.21 | 14.7 |
| 53:16:31 | 2.0 | 2.0:0.5 | 0.27 | 14.0 |
| 45:16:40 | 4.0 | 0.6:0.7 | 0.44 | 12.3 |
| 37:14:49 | 5.9 | 1.9:0.9 | 1.01 | 10.8 |
| 32:14:54 | 8.0 | 1.0:1.2 | 3.40 | 9.8 |
| | | | | |
| 62:38:0 | 0 | 3.9:0.3 | 0.26 | 12.5 |
| 38:29:33 | 1.7 | 1.4:0.6 | 0.50 | 9.8 |
| 29:25:47 | 4.0 | 2.0:1.1 | 2.10 | 8.4 |
| 23:22:55 | 5.9 | 1.3:1.1 | 35.2 | 8.0 |
| 20:21:59 | 7.9 | 1.2:1.3 | 317 | 7.7 |
| | | | | |
| 42:58:0 | 0 | 1.1:0.4 | 0.24 | 10.1 |
| 23:41:36 | 2.0 | 0.6:1.1 | 1.61 | 7.3 |
| 15:33:52 | 3.9 | 3.5:1.1 | 284 | 6.0 |
| 13:31:57 | 5.7 | 3.2:0.9 | > 10,000 | 5.7 |
| 12:30:57 | 7.8 | 5.5:1.0 | > 10,000 | 5.3 |
| | | | | |
| 53:47:0 | 0 | 2.9:0.1 | 0.25 | 11.3 |
| 28:34:37 | 2.0 | 1.8:1.1 | 0.88 | 8.5 |
| 21:29:51 | 3.9 | 1.8:1.2 | 16.7 | 7.1 |
| 17:27:56 | 5.8 | 2.7:1.1 | 5220 | 6.7 |
| 16:27:57 | 7.6 | 2.4:1.1 | > 10,000 | 6.1 |

FIG.12

SEMICONDUCTOR DEVICE INCORPORATING ELEMENTS FORMED OF REFRACTORY METAL-SILICON-NITROGEN AND METHOD FOR FABRICATION

This is a divisional of application(s) Ser. No. 09/760,245 filed on Jan. 12, 2001, now U.S. Pat. No. 6,545,339.

FIELD OF THE INVENTION

The present invention generally relates to a semiconductor device incorporating circuit elements that are formed of refractory metal-silicon-nitrogen and a method for such fabrication and more particularly, relates to a semiconductor device that incorporates circuit elements such as resistors, capacitors, fuses and diffusion barriers that are formed of metal-silicon-nitrogen and method for such fabrication.

BACKGROUND OF THE INVENTION

In semiconductor devices, capacitors, fuses and diffusion barriers are frequently formed in-situ in the semiconductor structure, while resistors are typically connected to a circuit board external to the semiconductor structure to provide required electrical resistance to an electronic circuit.

It is therefore difficult to provide resistors that are built in-situ in a semiconductor structure. It is particularly difficult to form in-situ resistors in a semiconductor structure to provide high resistance, i.e. to provide resistance in the range of more than several thousand Ω/sq. For instance, a resistor designed for use in a semiconductor device has been a diffusion resistor that is built on the surface of a semiconductor substrate. The sheet resistance of a diffusion resistor is typically in the range between about 100 Ω/sq. and about 4,000 Ω/sq. Moreover, it has not been possible to build unit resistors inside a semiconductor structure arranged in a vertical direction due to the unavailability of a material that can be used in a semiconductor process which has sufficiently high electrical resistivity and thermal stability.

While refractory metals have been frequently used in semiconductor processes to form vias or contacts, refractory metal-nitrogen alloys have not been widely used in the processing of semiconductor devices. For instance, only recently U.S. Pat. No. 5,892,281 described the use of tantalum-aluminum-nitrogen alloys in semiconductor devices as a diffusion barrier and an adhesion promoter. The patent discloses the use of Ta—Al—N in a semiconductor device to prevent inter-diffusion between surrounding layers, for instance, between two conductor layers, between a semiconductor layer and a conductor layer, between an insulator layer and a conductor layer, between an insulator layer and a semiconductor layer, or between two semiconductor layers. A second use of Ta—Al—N is to promote adhesion with adjacent layers, for instance, between two conductor layers, between a conductor layer and an insulator layer, between a semiconductor layer and a conductor layer, or between two semiconductor layers. However, U.S. Pat. No. 5,892,281 does not teach any other uses for tantalum-aluminum-nitrogen alloys in semiconductor devices.

It is therefore an object of the present invention to provide a semiconductor structure that contains at least one circuit element fabricated of refractory metal-silicon-nitrogen that does not have the drawbacks or shortcomings of conventional semiconductor structures.

It is another object of the present invention to provide a semiconductor structure that contains at least one circuit element selected from the group consisting of a fuse, a resistor, a trimable resistor, a diffusion barrier and a capacitor that is fabricated of a refractory metal-silicon-nitrogen alloy.

It is a further object of the present invention to provide a semiconductor structure that contains at least one circuit element in the structure that is fabricated of tantalum-silicon-nitrogen.

It is another further object of the present invention to provide a semiconductor structure that contains at least one circuit element that is fabricated of tantalum-silicon-nitrogen which contains between about 10 at. % and about 55 at. % Ta, between about 10 at. % and about 45 at. % Si, and between about 30 at. % and about 80 at. % nitrogen.

It is still another object of the present invention to provide a semiconductor structure that contains at least one resistor, at least one trimable resistor, at least one capacitor, at least one fuse and at least one diffusion barrier which are fabricated of refractory metal-silicon-nitrogen.

It is yet another object of the present invention to provide a method for fabricating a semiconductor structure that contains a fuse element by first forming a fuse element of refractory metal-silicon-nitrogen, and then ion-implanting the element to substantially increase its resistivity.

It is still another further object of the present invention to provide a method for fabricating a semiconductor structure that contains a trimable resistor element by first forming the element in refractory metal-silicon-nitrogen, heat treating the element to induce crystallinity, and then forming the element of lower resistivity.

It is yet another further object of the present invention to provide a method for fabricating a semiconductor structure that contains a diffusion barrier layer by first forming an electrical contact on top of a semiconductor substrate, and then depositing a layer of refractory metal-silicon-nitrogen on the electrical contact to form the diffusion barrier layer.

SUMMARY OF THE INVENTION

In accordance with the present invention, a semiconductor structure that contains at least one circuit element that is fabricated of refractory metal-silicon-nitrogen and a method for fabricating the semiconductor structure are provided.

In a preferred embodiment, a semiconductor structure is provided which contains at least one circuit element selected from the group consisting of a fuse, a diffusion barrier, a resistor, a trimable resistor, and a capacitor; the at least one circuit element is formed of refractory metal-silicon-nitrogen.

The semiconductor structure of the present invention may further include a pre-processed substrate formed of a semiconducting material or of an electrically insulating material. The refractory metal in the refractory metal-silicon-nitrogen may be selected from the group consisting of Ta, Nb, V, W and Ti. The refractory metal-silicon-nitrogen may be TaSiN which contains between about 10 at. % and about 55 at. % Ta, between about 10 at. % and about 45 at. % Si, and between about 30 at. % and about 80 at. % N. The semiconductor structure may further include at least one conductive element in electrical communication with the at least one circuit element, the at least one conductive element may be formed of a material selected from the group consisting of doped polysilicon, metal silicide, polycide, refractory metal, aluminum, copper and alloys thereof.

The present invention is further directed to a semiconductor structure that contains at least one resistor, at least one trimable resistor, at least one capacitor, at least one fuse and at least one diffusion barrier; the at least one resistor, the at least one trimable resistor, the at least one capacitor, the at least one fuse and the at least one diffusion barrier may be formed of refractory metal-silicon-nitrogen. By trimable resistor, it is meant a resistor which has a resistance value that is tunable by heat treatment.

The semiconductor structure may further include a pre-processed substrate onto which the at least one resistor, the at least one trimable resistor, the at least one capacitor, the at least one fuse and the at least one diffusion barrier are formed. The pre-processed substrate may be a silicon wafer. The refractory metal in the refractory metal-silicon-nitrogen may be selected from the group consisting of Ta, Nb, V, W and Ti. The refractory metal-silicon-nitrogen may be TaSiN which contains between about 10 at. % and about 55 at. % Ta, between about 10 at. % and about 45 at. % Si, and between about 30 at. % and about 80 at. % N.

The present invention is further directed to a method for fabricating a semiconductor structure that contains a fuse element which may be carried out by the operating steps of first providing a pre-processed substrate, forming a fuse element of refractory metal-silicon-nitrogen on the substrate; and ion-implanting the fuse element and increasing the sheet resistance of the fuse element to at least 3000 $\Omega/\square$.

The method for fabricating a semiconductor structure that contains a fuse element may further include the step of selecting a refractory metal for the refractory metal-silicon-nitrogen from the group consisting of Ta, Nb, V, W and Ti. The method for fabricating a semiconductor structure that contains a fuse element may further include the step of forming the fuse element with TaSiN. The composition of TaSiN may contain between about 10 at. % and about 55 at. % Ta, between about 10 at. % and about 45 at. % Si, and between about 30 at. % and about 80 at. % N. The method may further include the step of ion-implanting the fuse element with N/Si and/or O. The method may further include the step of implanting the fuse element with N/Si and/or 1 at an implantation dose between about $1 \times 10^{14}$ atm/cm$^2$ and about $1 \times 10^{16}$ atm/cm$^2$.

The present invention is still further directed to a method for fabricating a semiconductor structure that contains a trimable resistor element which includes the steps of first providing a pre-processed substrate; forming a trimable resistor element of a refractory metal-silicon-nitrogen material that has a resistivity lower than 450 $\mu\Omega$-cm; heat-treating the trimable resistor element to induce crystallinity; and forming the trimable resistor element that has at least a 10% decrease in resistivity.

The method for fabricating a semiconductor structure that contains an trimable resistor element may further include the step of heat-treating the trimable resistor element in a $N_2/O_2$ gas for a time period between about 0.5 hr and about 5 hr, or the step of heat-treating in a $N_2/O_2$ gas at a temperature between about 800° C. and about 1100° C.

The method for fabricating a semiconductor structure that contains a trimable resistor element may further include the step of forming the trimable resistor element in a via opening.

The present invention is still further directed to a method for fabricating a semiconductor structure that contains a diffusion barrier layer which can be carried out by the operating steps of first providing a pre-processed semiconductor substrate; forming an electrical contact on top of the semiconductor substrate; and depositing a layer of refractory metal-silicon-nitrogen on the electrical contact forming the diffusion barrier layer.

The method for fabricating a semiconductor structure that contains a diffusion barrier layer may further include the step of selecting the refractory metal in the refractory metal-silicon-nitrogen from the group consisting of Ta, Nb, V, W and Ti, or the step of forming the diffusion barrier layer with TaSiN containing between about 10 at. % and about 55 at. % Ta, between about 10 at. % and about 45 at. % Si, and between about 30 at. % and about 80 at. % N.

BRIEF DESCRIPTION OF THE DRAWINGS

These and other objects, features and advantages of the present invention will become apparent from the following detailed description and the appended drawings in which:

FIG. 12 is a table illustrating physical properties of various TaSiN compositions.

DETAILED DESCRIPTION OF THE PREFERRED AND ALTERNATE EMBODIMENTS

Figure 1:
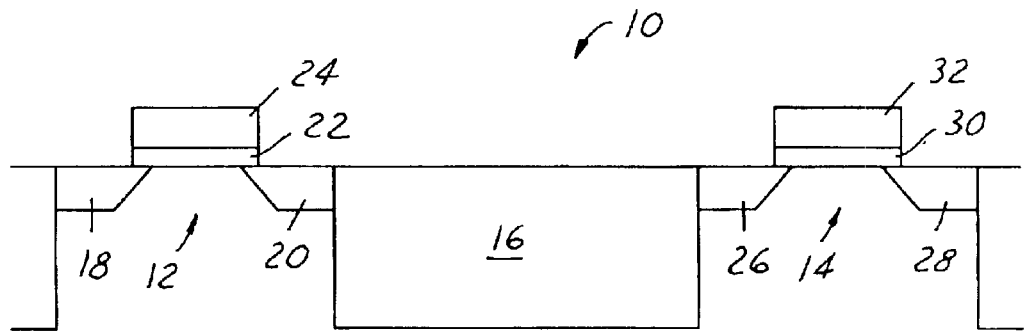
FIG. 1 is an enlarged, cross-sectional view of a present invention CMOS structure.

The present invention discloses a semiconductor structure that includes at least one circuit element selected from the group consisting of a fuse, a diffusion barrier, a resistor, a trimable resistor and a capacitor; the at least one circuit element may be formed of refractory metal-silicon-nitrogen. The structure further includes a pre-processed substrate which may be formed of a semi-conducting material or of an electrically insulating material. The refractory metal in the refractory metal-silicon-nitrogen compound may be selected from the group of elements consisting of Ta, Nb, V, W and Ti. In a typical refractory metal-silicon-nitrogen composition of TaSiN, the composition may contain between about 10 at. % and about 55 at. % Ta, between about 10 at. % and about 45 at. % Si, and between about 30 at. % and about 80 at. % N. The semiconductor structure may also include at least one conductive element that is used to establish an electrical connection with the circuit element, the at least one conductive element may be formed of doped polysilicon, metal silicide, polycide, refractory metal, aluminum, copper and alloys thereof.

The present invention further discloses a semiconductor structure that includes at least one resistor; at least one trimable resistor, at least one capacitor; at least one fuse and at least one diffusion barrier. The at least one resistor, the at least one capacitor, the at least one fuse and the at least one diffusion barrier may be formed of a refractory metal-silicon-nitrogen compound.

The present invention further discloses a method for fabricating a semiconductor structure that contains a fuse element which can be carried out by first providing a pre-processed substrate; then forming a fuse element of refractory metal-silicon-nitrogen on the substrate; and then ion-implanting the fuse element to increase its sheet resistance to a value of at least 3000 $\Omega/\square$.

The present invention further discloses a method for fabricating a semiconductor structure that contains a trimable resistor element which can be carried out by the operating steps of first providing a pre-processed substrate; then forming a trimable resistor element of a refractory metal-silicon-nitrogen material which has a resistivity lower than 450 $\mu\Omega$-cm; then heat-treating the trimable resistor element to induce crystallinity; and then forming the trimable resistor element which has at least a 10% decrease in resistivity.

The invention still further discloses a method for fabricating a semiconductor structure that contains a diffusion barrier layer which can be carried out by the steps of first providing a pre-processed semiconductor substrate; then forming an electrical contact on top of the semiconductor substrate; and then depositing a layer of refractory metal-silicon-nitrogen on top of the electrical contact to form the diffusion barrier layer.

The present invention further discloses an integration scheme which enables the use of refractory metal-silicon-nitrogen films as diffusion barriers, resistors, fuses and capacitors in various semiconductor devices. The refractory metal-silicon-nitrogen films, such as $Ta_xSi_yN_z$, have the advantage of being either insulating or resistive depending on the ratio of the refractory metal to the silicon to the nitrogen. The films are thermally stable to annealing at temperatures up to 600° C. For instance, as shown by various compositions in FIG. 12, the resistivity of $Ta_xSi_yN_z$ can vary from about 210 $\mu\Omega$-cm (or about $10^2$ $\mu\Omega$-cm) to about $10^7$ $\mu\Omega$-cm depending on the ratio of Ta:Si:N in the deposited film. The desirable wide range of resistive values available for these materials allows for smaller circuit elements to be created when compared to those previously formed by other techniques. For instance, a 99% area savings may be achieved when a standard silicon implanted resistor used for voltage stabilization applications is replaced with $Ta_{17}Si_{27}N_{56}$ (for implanted Si at 600 $\Omega$/sq., an area of 6956 $\mu$m×0.25 $\mu$m is required; for $Ta_{17}Si_{27}N_{56}$, only an area of 4 $\mu$m×0.25 $\mu$m is required). The invention therefore enables the integration of refractory metal-silicon-nitrogen films for low resistive diffusion barriers, for high resistance resistors and fuses and for insulating dielectrics to be formed in the same semiconductor structure.

In the present invention novel method, Ta:Si:N is advantageously used as a high-density resistor such that significant chip layout area can be saved. A second advantage made possible by the present invention method is the integration of high-density resistors with other semiconductor elements including fuses and trimable resistors and capacitors which are formed by the same refractory metal-silicon-nitrogen material. A further advantage of the present invention method is the ability to modify the resistivity of a Ta:Si:N conductor.

Referring initially to FIGS. 1–4, in which an integration of refractory metal-silicon-nitrogen diffusion barriers/fuses/resistors and capacitors into a semiconductor structure is shown in a CMOS logic device 10. In FIG. 1, transistors 12 and 14 are isolated by a shallow trench isolation (STI) region 16 of an insulating material. The transistor 12 is formed by source 18, drain 20, gate oxide 22 and conductive gate 24. Similarly, transistor 14 is formed by source 26, drain 28, gate oxide 30 and conductive gate 32.

Figure 2:
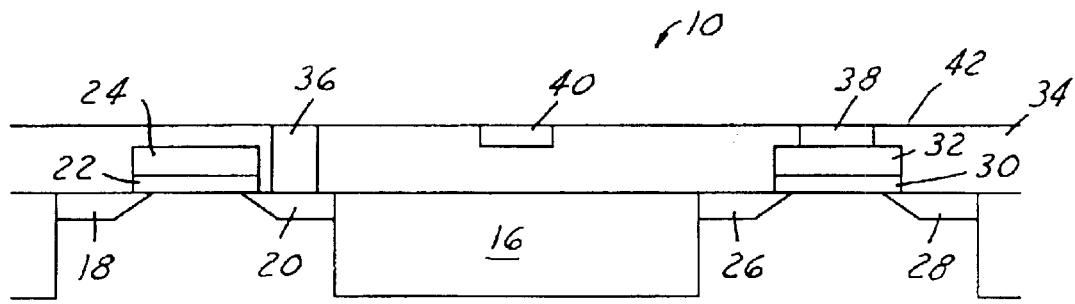
FIG. 2 is an enlarged, cross-sectional view of the present invention CMOS structure of FIG. 1 with an insulating material layer deposited on top and contact openings formed through the insulating material layer.

In the next step of the process, as shown in FIG. 2, a layer 34 of an insulating material, such as silicon oxide or silicon nitride, is blanket deposited on top of the semiconductor device 10 with via openings 36, 38 formed for contact to transistors 12 and 14, respectively. An opening 40 for a conductive trace is also formed in the insulating material layer 34. The openings 36, 38 and 40 are then filled with a conductive material, i.e. doped polysilicon or tungsten, and then planarized back to the surface 42 of the insulating material layer 34.

Figure 3:
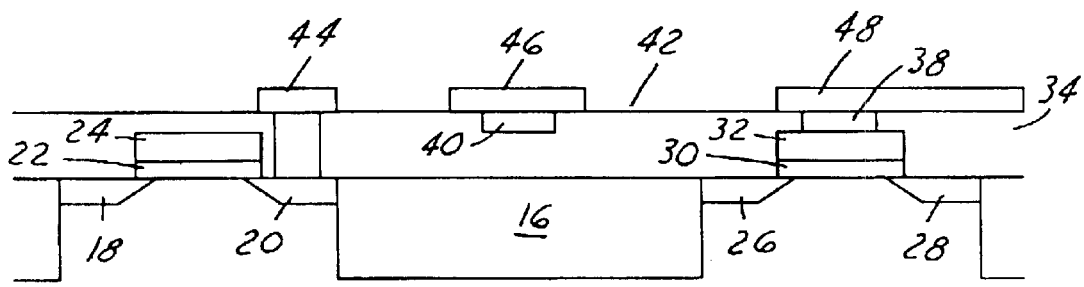
FIG. 3 is an enlarged, cross-sectional view of the present invention CMOS structure of FIG. 2 with a refractory metal-silicon-nitrogen layer deposited and patterned on top for a diffusion barrier, a fuse, a high resistance resistor and a trimable resistor.

As shown in FIG. 3, a diffusion barrier/fuse/resistor material of a refractory metal-silicon-nitrogen is then deposited and patterned into a diffusion barrier 44, a fuse 46 and a high resistance resistor 48. In a first preferred embodiment, the resistivity of the diffusion barrier 44, the fuse 46 and the high resistance resistor 48 are the same since the film composition in each layer is exactly the same.

Figure 4:
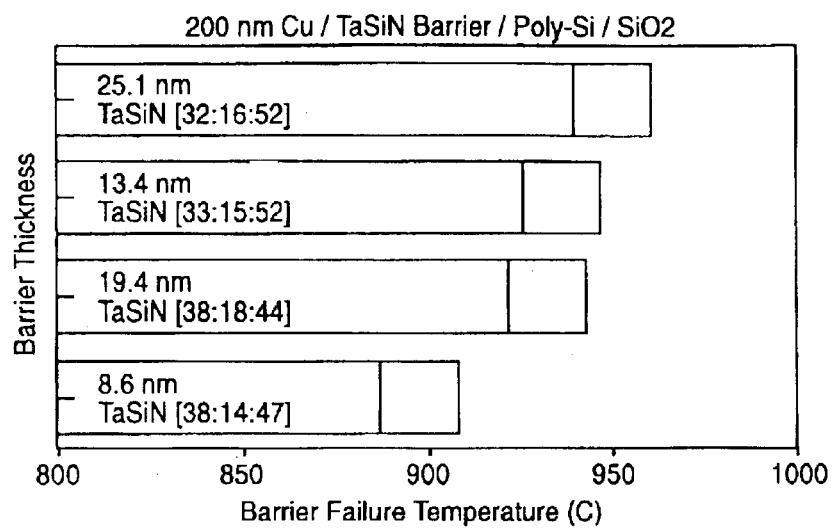
FIG. 4 shows a plot of TaSiN diffusion barrier failure temperature as a function of tantalum-silicon-nitride barrier thickness.

FIG. 4 shows the Cu diffusion barrier properties of the TaSiN material. For this experiment TaSiN barriers of various thicknesses (8.6–25.1 nm) were UHV co-sputtered (as previously described) between a 200 nm Cu film and polycrystalline Si. In-situ x-ray diffraction analysis was used to determine the temperature at which the barrier failed by monitoring the Cu silicide diffraction peak. The range in failure is indicated by the dark region at the end of each bar. The data shows the barriers as thin as 9 nm are still very effective in preventing Cu penetration.

Figure 5:
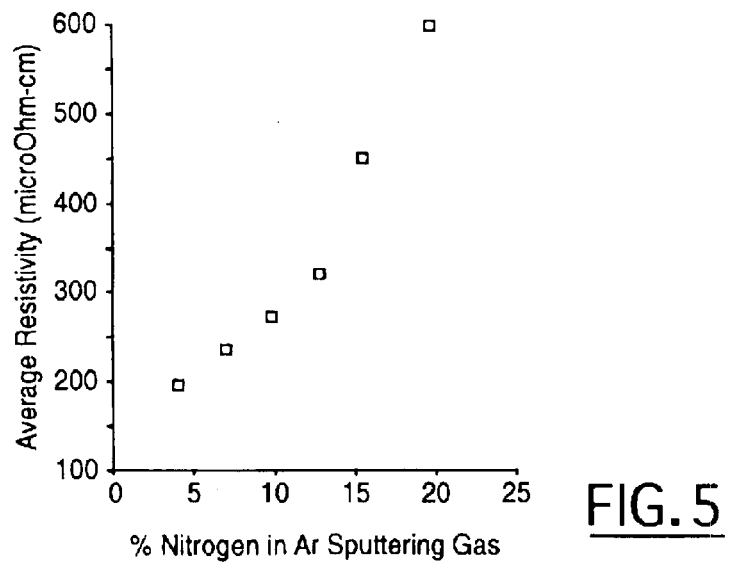
FIG. 5 shows the resistivity of the tantalum-silicon-nitride material as deposited as a function of nitrogen in the argon sputtering gas plasma.

FIG. 5 shows the as-deposited resistivities for TaSiN materials deposited with 4 to 20% nitrogen in the Ar sputtering plasma. As shown, the resistivities range between about 200 and 600 micro Ohm-cm.

Figure 6:
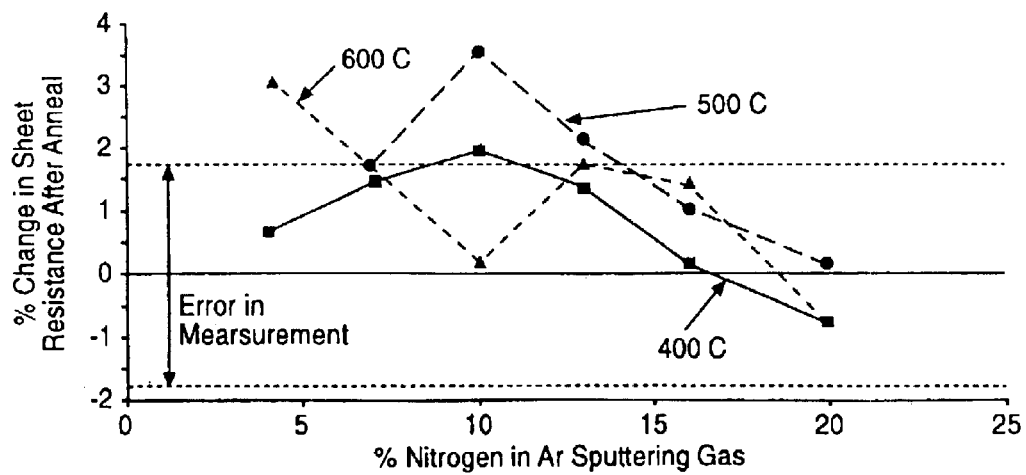
FIG. 6 is a plot showing the change in sheet resistance of TaSiN material after a ramped anneal (400, 500 and 600° C.) as a function of nitrogen in the argon sputtering plasma.

FIG. 6 shows the thermal stability of the TaSiN material when used as a resistor. The material is amorphous as deposited and crystallizes at the temperatures shown in FIG. 7. Before crystallization, since it is amorphous, there are no microstructural changes which take place (i.e. grain growth) which make it a material with a stable resistivity. FIG. 6 shows the change in sheet resistance of the TaSiN thin films after annealing at 400, 500 and 600° C. As shown, there is very little change in the sheet resistance and for the most part it is within the error of the measurement.

Figure 7:
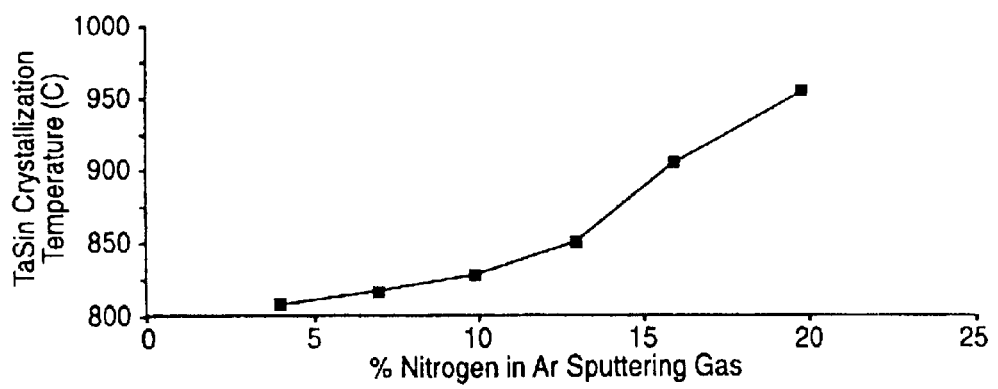
FIG. 7 shows the tantalum-silicon-nitride crystallization temperature as a function of nitrogen in the argon sputtering plasma.

FIG. 7 shows the temperature of crystallization of the TaSiN material which leads to a decrease in sheet resistance. The technique of time resolved x-ray diffraction analysis was used to obtain the data. Depending on the nitrogen incorporation, the film crystallizes at temperatures between about 800 and 1000° C. The crystallization temperature increases with increasing nitrogen content.

Figure 8A:
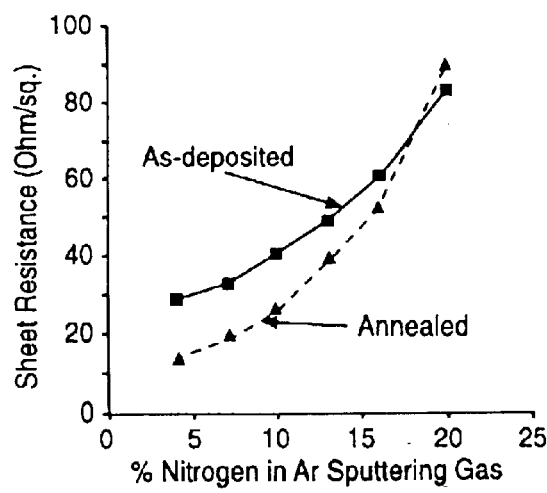
FIG. 8A shows the as deposited sheet resistance of the material as a function of nitrogen in the argon sputtering plasma and the sheet resistance after an 1100° C. heat treatment.
Figure 8B:
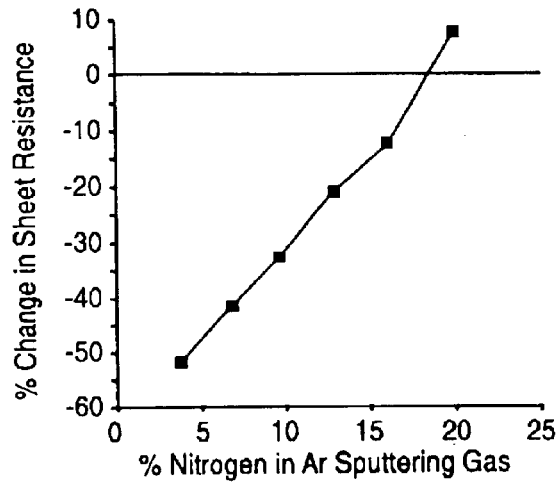
FIG. 8B shows the change in sheet resistance due to the thermal treatment.

FIG. 8A shows the as-deposited and post annealing sheet resistance values for the films described above. The films were heat treated at a temperature ramp rate of 3° C./s from 25 to 1100° C. in nitrogen. FIG. 8B shows the change in sheet resistance due to the thermal treatment. As shown for compositions deposited with less than 16% nitrogen in the Ar sputtered plasma (<450 micro Ohm-cm in resistivity), at least a 10% decrease in the resistivity after the anneal treatment is obtained. The resistance of the resistor can thus be changed to achieve a trimable resistor. The heat treatment can be completed in a furnace, rapid thermal anneal (RTA) system or with a laser.

Figure 9:
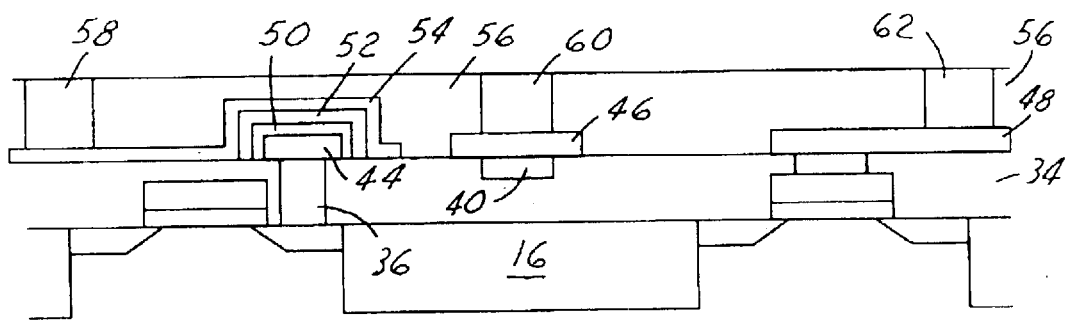
FIG. 9 is an enlarged, cross-sectional view of the present invention CMOS structure of FIG. 3 with a capacitor stack and an insulating material layer formed on top.

In the next step of the process, as shown in FIG. 9, an electrode 50, a dielectric layer 52 and an electrode 54 (i.e. a capacitor stack) are deposited and formed over the diffusion barrier 44. An insulating material layer 56 is then deposited over the entire wafer and contact openings 58,60 and 62 are etched which are later filled with a conductive material for forming electrical contacts to the diffusion barrier 44, the fuse 46 and the resistor 48, respectively. In the particular structure shown in FIG. 9, the diffusion barrier 44 prevents reaction between the platinum electrode 50 and the polysilicon contact via 36. The fuse 46 can be blown by forcing a large current through the line-fuse material-via (40, 46 and 60) structure, causing excessive heating and melting in the fuse material and thus, loss of electrical conductivity. The high resistance resistor 48 can be patterned to produce a desired resistance value needed for circuit operation.

Tables 1 and 2 show data which pertains to the use of the TaSiN material as a dielectric for a capacitor application. Two different TaSiN films were evaluated. Both were deposited in an ultra-high vacuum system (UHV) by co-sputtering from Ta and Si targets reactively in the presence of nitrogen. The first sample in Table 1 had a composition of Ta:Si:N 7.7:30.7:61.5 (50% nitrogen in Ar plasma) and the second sample in Table 2 has a composition of 9.8:30.2:59.9 (30% nitrogen in Ar plasma). In Tables 1 and 2, the dielectric constant for the materials is listed as a function of frequency using a C-V measurement technique. The dielectric constant decreases slightly with frequency mainly due to the increase in the dissipation factor. This insulating material has a dielectric constant between 8.0 and 9.5.

TABLE 1

| Frequency (hz) | Capacitance (pF) | Dissipation Factor | Dielectric Constant (k) |
|---|---|---|---|
| 10 k | 249 pF | 0.020 | 9.5 |
| 40 k | 242 pF | 0.021 | 9.2 |
| 100 k | 238 pF | 0.029 | 9.1 |

75.5 nm Ta:Si:N (50% $N_2$ in Ar) 7.7:30.7:61.5 - 21 mill dot - 0.002235 $cm^2$ area

TABLE 2

| Frequency (hz) | Capacitance (pF) | Dissipation Factor | Dielectric Constant (k) |
|---|---|---|---|
| 10 k | 283 pF | 0.010 | 8.4 |
| 40 k | 274 pF | 0.034 | 8.1 |
| 100 k | 267 pF | 0.050 | 7.9 |

58.7 nm Ta:Si:N (30% $N_2$ in Ar) 9.8:30.2:59.9 - 21 mill dot - 0.002235 $cm^2$ area In the first preferred embodiment shown in FIGS. 1–3 and 9, the refractory metal-silicon-nitrogen film used for the diffusion barrier 44, the fuse 46 and the resistor 48 has the same resistivity even though the final resistance of each material could be different due to differences in the lengths and in the widths of the layers, the thicknesses when the device is produced by a Damascene process.

In a second preferred embodiment, it is possible to produce a diffusion barrier, a fuse and a resistor by refractory metal-silicon-nitrogen films that have different resistivity values by a single refractory metal-silicon-nitrogen film deposition process. In this embodiment, the structure is first prepared as shown in FIG. 3. The refractory metal-silicon-nitrogen film composition is chosen, i.e. from FIG. 12, to provide a low resistance film to meet most conductive requirements for the desired circuit. In most instances, it is desirable for the diffusion barrier to have the lowest resistivity.

Figure 10:
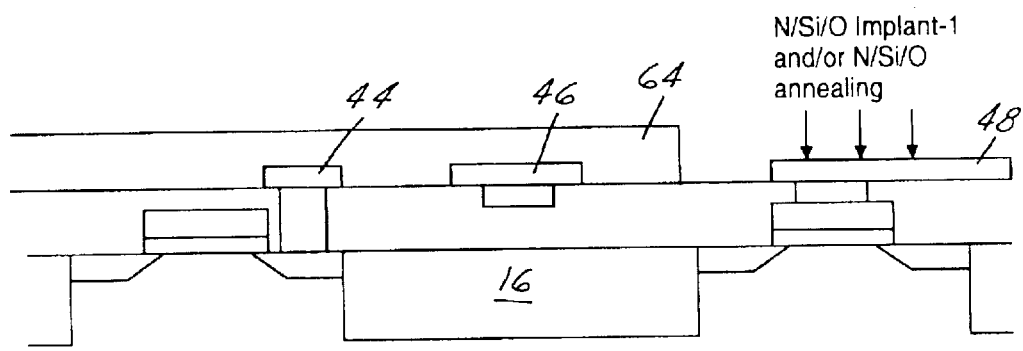
FIG. 10 is an enlarged, cross-sectional view of the present invention CMOS structure with selective masking formed on top for ion-implanting selective areas of the structure.

As shown in FIG. 10, after the formation of the separate diffusion barrier 44, the fuse 46 and the resistor 48, some of the refractory metal-silicon-nitrogen elements are selectively masked by using a standard photoresist in an insulator deposition/etch technique. The resistance of the exposed elements, i.e. 48 shown in FIG. 10, can be increased by either implanting with N/Si and/or O, or by annealing in a nitrogen/oxygen gas. The treatment can be carried out in either a furnace, a RTA or by laser annealing, for instance, during the implantation process, the diffusion barrier 44 and the fuse 46 can be masked by a photoresist layer 64. The incorporation of oxygen or nitrogen into the exposed resistor 48 changes the composition ratio for the resistor in the exposed refractory metal-silicon-nitrogen material and thus increasing its resistivity. The data can be seen in FIG. 12.

Figure 11:
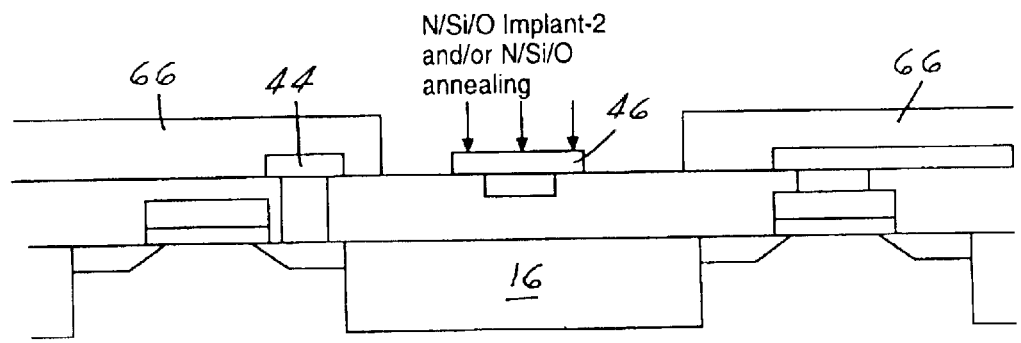
FIG. 11 is an enlarged, cross-sectional view of the present invention CMOS structure after selective masking and ion-implantation are carried out on top of the structure.

The process can be repeated for the fuse 46 as shown in FIG. 11 when the other components are masked by a photoresist layer 66. The process results in the formation of various refractory metal-silicon-nitrogen elements in a semiconductor device that have different sheet resistances. This allows, for example, a low sheet resistance diffusion barrier to be formed and a high sheet resistance resistor along with a very high sheet resistance fuse to be formed by a single refractory metal-silicon-nitrogen film deposition process. It also allows the selective formation of isolated capacitor structures by the incorporation of a large amount of either nitrogen and/or oxygen into an exposed film to convert its electrical characteristics from resistive to insulating.

In the present invention device that includes a fuse element, the fuse element may be formed by depositing, annealing and patterning a TaSiN film layer on a semiconductor substrate. The fuse element initially, as deposited, has a low resistivity, after programmed by a focused ion beam (FIB) implantation process, the resistivity of the fuse element increases substantially due to the thermal degradation of the TaSiN material.

The trimable resistor element originally, as deposited, has a amorphous structure and has a high resistivity. After programming by forcing a certain amount of current through the trimable resistor element, the resistivity of the element decreases due to TaSiN crystallization. The trimable resistor element may further be programmed by forcing a moderate amount of current through the element, assisted by a local heating mechanism to decrease its resistivity due to TaSiN crystallization. The local heating mechanism can be achieved by utilizing a laser beam programming.

By utilizing the present invention novel method, a high-density resistor element may be formed by first depositing a TaSiN film layer inside a via opening, and then by chemical mechanical polishing or by etching-back planarization to remove the excess material.

The present invention novel method enables the formation of a diffusion barrier element as a contact barrier by depositing TaSiN on top of at least one contact to prevent the contact from being oxidized or to prevent the diffusion of a second material into the electrical contact. The diffusion barrier element may further be formed as a contact barrier on and recessed inside a via of contact to prevent the contact via from being oxidized or to prevent the diffusion of a second material into the contact via. A chemical mechanical polishing or etch-back planarization process may also be used to remove the excess material.

Similarly, the present invention diffusion barrier element may be used as a metal wire barrier and formed by depositing TaSiN film layer on top of a semiconductor substrate and covered by a metal layer. The metal wire is formed by patterning and etching the metal and the barrier layer. The barrier layer can be used to prevent the metal wire from being oxidized or to prevent diffusion of a second material into the metal wire. The metal wire utilized may be formed of copper.

The present invention method for forming a resistor element, a trimable resistor element, a fuse element and a contact barrier element on a semiconductor structure may be carried out by first providing a semiconductor substrate; then forming active devices including transistors, diodes, sensors on the substrate; then forming an electrically insulating layer over the active devices; then forming contacts and interconnects to the active devices; then forming a thin layer of TaSiN material over the active devices with the contacts and wirings; then patterning the TaSiN material layer to form resistor elements, fuse elements and contact barrier elements, then covering the semiconductor structure including barrier and fuse elements with a dummy photoresist mask, then ion-implanting $O_2/N_2/Si$ into the exposed resistor element such that the resistivity of the resistor element becomes substantially higher than that of the barrier and the fuse element; then cover the semiconductor structure with a layer of dielectric material; and selectively open up the dielectric in the fuse element area which may be later programmed.

The present invention novel semiconductor structure which includes at least one circuit element of a fuse, a resistor, a trimable resistor, a diffusion barrier or a capacitor that is formed of refractory metal-silicon-nitrogen and a method for such fabrication have therefore been amply described in the above description and in the appended drawings of FIGS. 1–12.

While the present invention has been described in an illustrative manner, it should be understood that the terminology used is intended to be in a nature of words of description rather than of limitation.

Furthermore, while the present invention has been described in terms of a preferred and several alternate embodiments, it is to be appreciated that those skilled in the art will readily apply these teachings to other possible variations of the inventions.

The embodiment of the invention in which an exclusive property or privilege is claimed are defined as follows.

What is claimed is:

1. A method for fabricating a semiconductor structure containing a fuse element comprising the steps of:
    providing a pre-processed substrate;
    forming said fuse element of refractory metal-silicon-nitrogen on said substrate; and
    ion-implanting said fuse element and increasing the sheet resistance of said fuse element to at least 3000 $\Omega/\square$.

2. The method for fabricating a the semiconductor structure containing the fuse element according to claim 1 further comprising the step of selecting a refractory metal for said refractory metal-silicon-nitrogen from the group consisting of Ta, Nb, V, W and Ti.

3. The method for fabricating the semiconductor structure containing the fuse element according to claim 1 further comprising the step of forming said fuse element with TaSiN.

4. The method for fabricating the semiconductor structure containing the fuse element according to claim 1 further comprising the step of forming said fuse element with TaSiN that contains between about 10 at. % and about 55 at. % Ta, between about 10 at. % and about 45 at. % Si, and between about 30 at. % and about 80 at. % N.

5. The method for fabricating the semiconductor structure containing the fuse element according to claim 1 further comprising the step of ion-implanting said fuse element with at least one of N/Si and O.

6. The method for fabricating the semiconductor structure containing the fuse element according to claim 1 further comprising the step of ion-implanting said fuse element with at learnt one of N/Si and O at an implantation density between about $1 \times 10^{14}$ atm/cm$^2$ and about $1 \times 10^{16}$ atm/cm$^2$.

7. A method for fabricating a semiconductor structure containing a trimable register element comprising the steps of:
    providing a pro-processed substrate;
    forming a trimable resistor element of a refractory metal-silicon-nitrogen material having a resistivity lower than 450 $\mu\Omega$-cm;
    heat treating said trimable resistor element to induce crystallinity, thereby reduce the resistivity by at least 10%.

8. The method for fabricating the semiconductor structure containing the trimable resistor element according to claim 7 further comprising the step of heat-treating in a $N_2/O_2$ gas.

9. The method for fabricating the semiconductor structure containing the trimable resistor element according to claim 7 further comprising the step of heat-treating in a $N_2/O_2$ gas for a time period between about 0.5 hr and about 5 hr.

10. The method for fabricating the semiconductor structure containing the trimable resistor element according to claim 7 further comprising the step of heat-treating in a $N_2/O_2$ gas for a time period between about 0.5 hr and about 5 hr at a temperature between about 800° C. and about 1100° C.

11. The method for fabricating the semiconductor structure containing the trimable resistor element according to claim 7 further comprising the step of heat-treating by rapid thermal anneal for a time period between about 0.1 sec and about 120 sec at a temperature between about 800° C. and about 1100° C.

12. The method for fabricating the semiconductor structure containing the trimable resistor element according to claim 7 further comprising the step of heat-treating by laser annealing.

* * * * *